(12) United States Patent
Chheda et al.

(10) Patent No.: US 6,614,062 B2
(45) Date of Patent: Sep. 2, 2003

(54) SEMICONDUCTOR TILING STRUCTURE AND METHOD OF FORMATION

(75) Inventors: Sejal N. Chheda, Austin, TX (US); Edward O. Travis, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/761,885

(22) Filed: Jan. 17, 2001

(65) Prior Publication Data

US 2002/0093071 A1 Jul. 18, 2002

(51) Int. Cl.$^7$ .......................... H10L 27/10; H10L 29/76; H10L 29/94; H10L 31/062; H10L 31/113; H10L 31/119; H10L 29/00; H10L 27/12; H10L 31/0392

(52) U.S. Cl. .................. 257/206; 257/204; 257/374; 257/510; 257/350

(58) Field of Search ................... 257/374, 395–400, 257/510–521, 69, 195, 204, 206, 338, 350, 351–359, 365–377

(56) References Cited

U.S. PATENT DOCUMENTS

| 5,206,535 A | | 4/1993 | Namose | |
|---|---|---|---|---|
| 5,885,856 A | * | 3/1999 | Gilbert et al. | 438/129 |
| 5,949,125 A | | 9/1999 | Meyer | |
| 6,232,640 B1 | * | 5/2001 | Okada et al. | 438/253 |
| 6,281,049 B1 | | 8/2001 | Lee | |
| 6,291,870 B1 | | 9/2001 | Kawashima et al. | |
| 2002/0000632 A1 | * | 1/2002 | Kobayashi et al. | 257/499 |

FOREIGN PATENT DOCUMENTS

| EP | 0 825 644 A1 | 2/1998 |
|---|---|---|
| JP | 11016999 | 1/1999 |
| JP | 2000349143 | 12/2000 |
| JP | 2001144171 | 5/2001 |
| WO | WO 96/15552 | 5/1996 |

OTHER PUBLICATIONS

George Y. Liu et al., "Chip–Level CMP Modeling And Smart Dummy For HDP And Conformal CVD Films", Proceedings of CMP–MIC Feb. 11, 1999, (8 pgs).

* cited by examiner

*Primary Examiner*—Steven Loke
*Assistant Examiner*—Samuel A Gebremariam
(74) *Attorney, Agent, or Firm*—Robert A. Rodriguez; Kim-Marie Vo

(57) ABSTRACT

A semiconductor device and method of fabrication are disclosed. The device includes a first trench isolation region having an allowable tiling area and a second trench isolation region having an allowable tiling area, wherein the second trench isolation region is doped differently from the first trench isolation region. First tile structures disposed within first trench isolation region have a first set of design parameters while second tile structures disposed within the second trench isolation region have a second set of design parameters. At least one of the first set of design parameters is different from a corresponding design parameter in the second set of design parameters. The corresponding design parameters may include the density, size, pitch, shape, exclusion distance, minimum width, minimum length, and minimum area. The first trench isolation region may be doped with a first-type dopant and the second trench isolation region may be undoped or doped with an opposite second-type dopant.

20 Claims, 6 Drawing Sheets

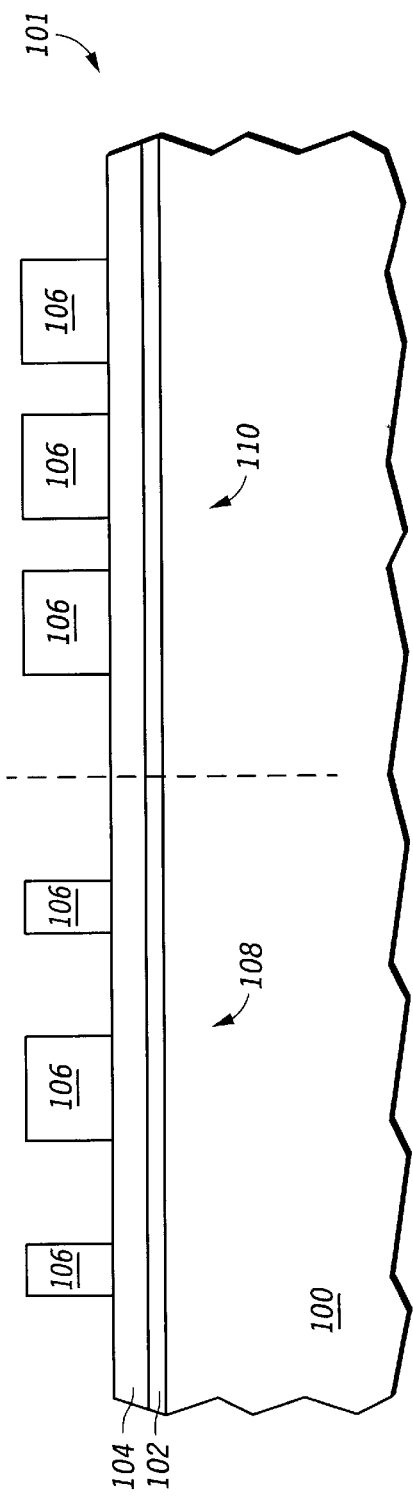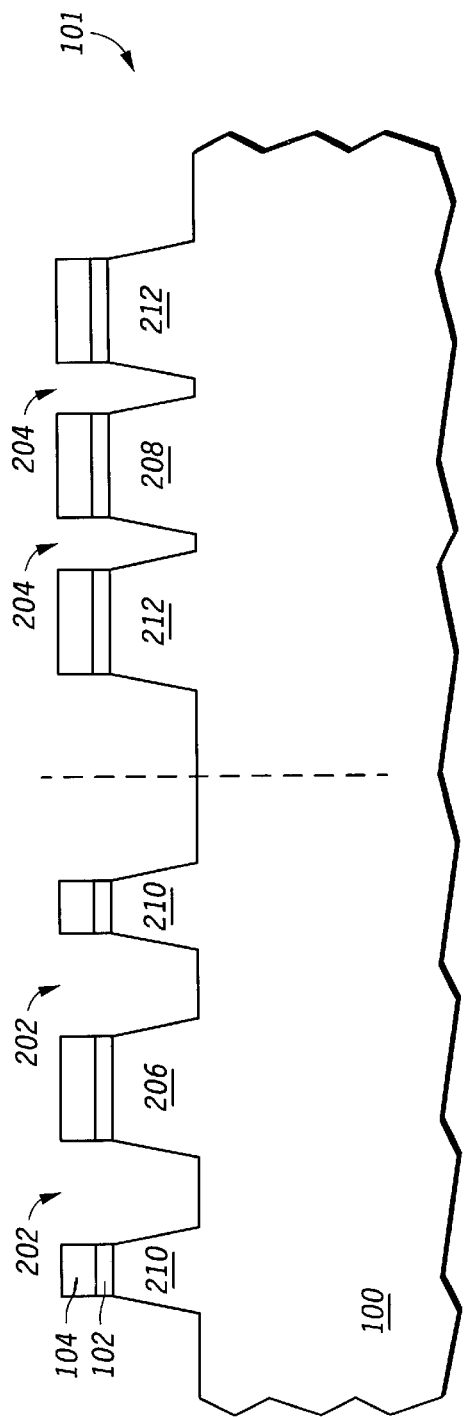

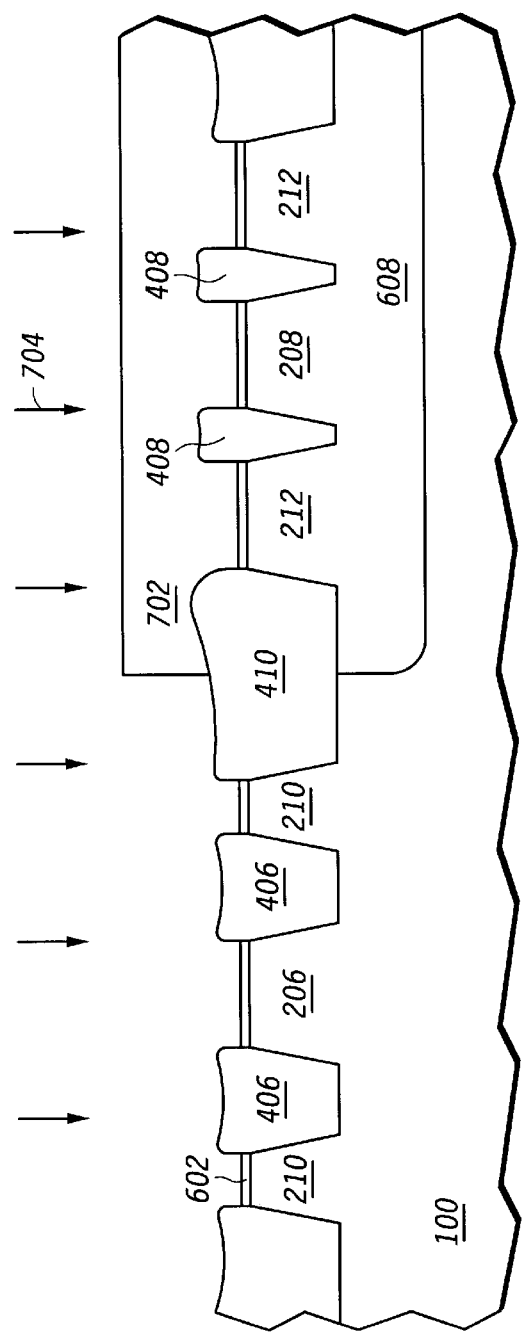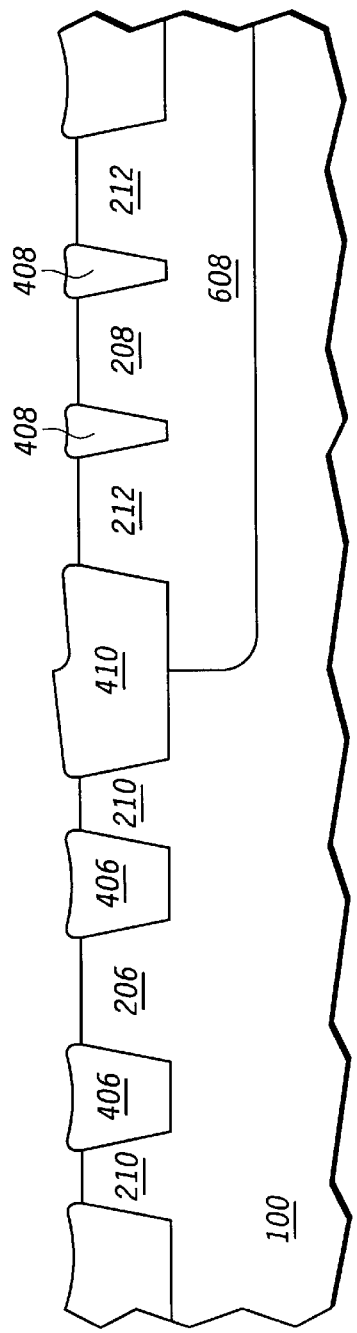

SEMICONDUCTOR TILING STRUCTURE AND METHOD OF FORMATION

RELATED APPLICATION

The present application entitled "Semiconductor Device In A Process For Designing A Mask", docket number SC91115A which shares a common assignee with the present application and is incorporated by reference.

FIELD OF THE INVENTION

The present application is related to the field of semiconductor device fabrication and more particularly to a semiconductor process in which structural tiles are selectively incorporated into one or more layers of the device based upon a variety of parameters to improve overall planarity.

RELATED ART

For a majority of semiconductor fabrication manufacturers using CMOS processes, there is typically a transistor isolation module that involves the active and well levels. It is highly desirable to achieve a substantially planar surface upon which transistors are formed after completion of the active and well level processes. Topography modeling and model-based tiling have been used to produce a more planar surface upon which the transistors are built. Tiling refers to the process of placing dummy (i.e., non-functional) structures on a mask to reduce topographical variations. In a mask that defines, for example, the isolation structures of a device (the isolation mask) "islands" or "tiles" of active regions may be incorporated within an isolation trench for the sole purpose of producing a more uniform surface upon which to fabricate subsequent layers of the device. Conventional topography modeling and model-based tiling have typically been based solely upon the layout or spatial geometry of a particular layer. The tiling of the isolation mask, for example, has been typically based solely on the size and spacing of isolations structures in the mask. Thus, conventional topography modeling at the active level does not take into account other factors such as topographical variation that may result from differential etch rates between N doped and P doped field oxide from the well masks.

Referring to FIG. 11, a partial cross-sectional view of a semiconductor wafer is depicted in which isolation trenches have been formed in the wafer substrate 1101 to define active regions 1103a and 1103b and dummy (i.e., non-functional) structures 1105 referred to herein as tiles. The trenches formed in a well 1109 of substrate 1101 are indicated by the reference numeral 1111 while the remaining isolation trenches are identified by reference numeral 1113. Those familiar with fabrication processes will appreciate that isolation trenches 1111 are typically implanted with an impurity species of a first polarity during the formation of well 1109 while trenches 1111 are typically doped with an impurity species of a second type. This difference in doping profiles and doping species results in a difference in etch rate when the trench oxide is etched. As depicted in FIG. 11, the different etch rate may result in a non-planar upper surface. Planar surfaces are highly desirable in the fabrication of deep sub-micro integrated circuits to increase depth of focus latitude and minimize other photolithographic and electrical problems. The amount of topographical variation resulting from oxide impurity concentration difference may be as significant as the active topography itself in determining the final planarization of a layer. It would therefore be desirable to implement semiconductor design and fabrication methods that account for topography variations caused by parameters other than the geometry or layout of one layer when there are several layers that can contribute to final topography.

BRIEF DESCRIPTION OF THE DRAWINGS

The present invention is illustrated by way of example and not limitation in the accompanying figures, in which like references indicate similar elements, and in which:

FIG. 1 is a partial cross sectional view of a semiconductor wafer on which an isolation mask pattern has been formed;

FIG. 2 illustrates a processing step subsequent to FIG. 1 in which isolation trenches are etched into the semiconductor substrate;

FIG. 7 illustrates a processing step subsequent to FIG. 6 in which a second well is formed in the wafer;

FIG. 8 illustrates a processing step subsequent to FIG. 7 in which a wet etch process has been performed to remove the sacrificial oxide from the active wafer surface;

Figure 3:
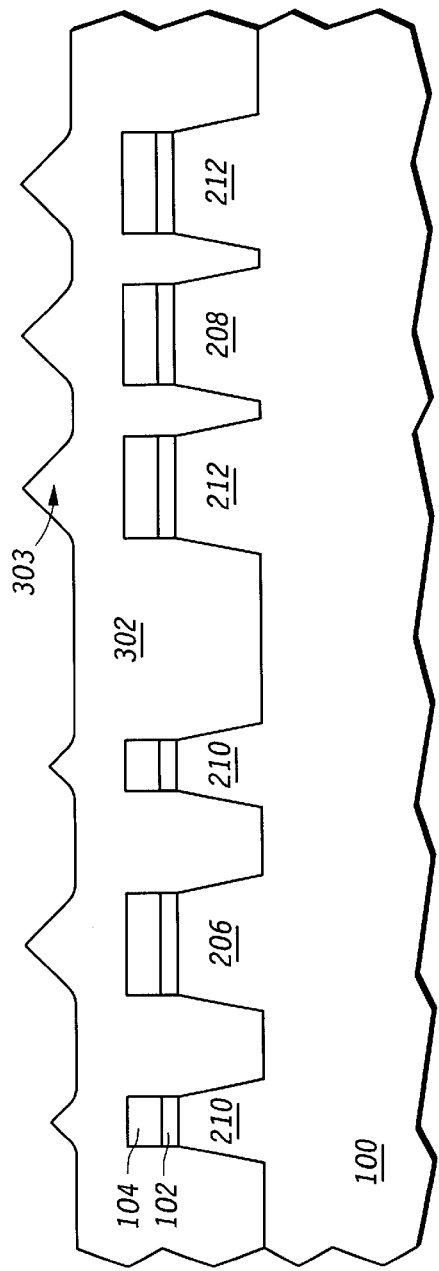
FIG. 3 illustrates a processing step subsequent to FIG. 2 in which a dielectric is blanket deposited over the wafer.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Generally speaking, the present invention contemplates a method of producing a substantially planar surface by incorporating various characteristics of the device into a topography model that is responsible for generating topography tiles. Topography tiles (also referred to as "tiles") refer to non-functional structures designed into isolation trenches for the purpose of improving planarity by eliminating large, unoccupied trench areas. The inclusion of information regarding, as an example, the dopant type of an oxide to be wet etched into a topography model generates a better topography model and ensures less spatial variation, (i.e., greater planarity) prior to a critical process level such as the gate module. If, for example, an N-well and P-well portion of a semiconductor device (integrated circuit) include similar active level patterns, the tiling for the two portions might differ to account for observable variations in the etch rates of the oxides within each well.

Turning now to FIG. 1, a partial cross sectional view of a semiconductor device 101 at an intermediate stage in a fabrication process is depicted. At the depicted stage in the process, semiconductor device 101 includes a semiconductor substrate 100 on which a pad oxide layer 102 and a nitride layer 104 have been deposited. Semiconductor substrate 100 is typically comprised of a single crystal silicon lattice that is lightly doped with a P-type dopant such as boron although other embodiments might utilize an n-type substrate. The substrate 100 includes a first trench isolation region 108 and a second trench isolation region 110. The area of both isolation regions is sufficient to accommodate structural tiles. In other words, both isolation regions are of sufficient dimension relative to the active structures within the region to accommodate the inclusion of structural tiles. Thus, the isolation regions 108 and 110 are said to have an allowable tiling area and are distinguished from isolation regions that lack sufficient area to accommodate tiles.

Pad oxide layer 102 may have a thickness of approximately 15 nanometers and nitride layer 104 may have a thickness of approximately 140 nanometers. A plurality of resist structures 106 have been patterned over nitride layer 104. In one embodiment, the pattern of resist structures 106 defines the location of isolation trenches that are subsequently formed within substrate 100.

Turning now to FIG. 2, an etch process is performed to form isolation trenches 202 and 204 into substrate 100 according to the pattern defined by resist structures 106 (which have been stripped and are not shown in FIG. 2). Typically, the formation of isolation trenches 202 and 204 is achieved with an anisotropic etch process such as a reactive ion etch (RIE) process. The formation of isolation trenches 202 and 204 results in the simultaneous formation of active region 206 and 208 and tiles 210 and 212.

In the depicted embodiment, first trench isolation region 108, active region 206, and tiles 210 are located in a P-well region of substrate 100 while second trench isolation region 110, active region 208, and tiles 212 are located in an N-well region of substrate 100. Thus, isolations regions 108 and 110 are doped with opposite dopant types and may be doped with different dopant concentrations such that the dopant concentration in first isolation region 108 is greater than the dopant concentration in second isolation region 110. In one embodiment, the dopant type of first and second isolation regions 108 and 110 are the same, but the dopant concentration is different.

Despite substantial similarity between active regions 206 and 208, the tiles 210 associated with active region 206 and the tiles 212 associated with active region 208 have different dimensions. In this embodiment, the etch characteristics of the wafer tile are dependent upon various tile design parameters including tile dimensions and spacing and the polarity of the well over which the tile is fabricated. Varying the design of tiles based upon well type reflects the observation that etch rates of P doped and N doped oxide may vary. To accommodate for this variation in etch rate and achieve a substantially planar surface after forming the active and well regions, the present invention contemplates varying the spacing and size of tiles based upon the well region in which the tile resides along with accounting for the active level topography.

Thus, as depicted in FIG. 2, device 101 includes a first trench isolation region 202 and a second trench isolation region 204 where the first and second trench isolation regions reside in respective regions of substrate 100 that will be subsequently doped with different implant species. First and second tiles structures 210 and 212 are characterized by a set of design parameters including their density, size, pitch, shape, exclusion distance (as described in greater detail below), minimum width, minimum length, and minimum area. First tile structure 210 located within first isolation region 202 has a first set of design parameter values while second tile structure 212 located within second trench isolation region 204 has a second set of design parameter values.

At least one of the first set of design parameter values is different from the corresponding value in the second set of design parameter values. With respect to the depicted embodiment, for example, first tile structure 210 is narrower and has a greater space from first active region 206 while second tile structure 212 is wider and has a narrower space with respect to second active region 208. In one embodiment (not depicted), tile structures are removed entirely from either first isolation region 108 or second isolation regions 110.

Turning now to FIG. 3, the isolation trenches 202 and 204 of FIG. 2 are filled with a dielectric material 302. In one embodiment, dielectric 302 comprises an oxide that is deposited with a high-density plasma (HDP) process. The cross section of FIG. 3 illustrates the characteristic profile of an HDP oxide deposited over topography. More specifically, the deposited dielectric 302 includes cone structures 303 that are defined over the underlying tile structures and active regions of substrate 100. The cones positioned over wide and/or dense structures such as active regions 206 and 208 and tile structures 212 are higher than the cones positioned over narrow and/or isolated structures such as tile structures 210.

Figure 4:
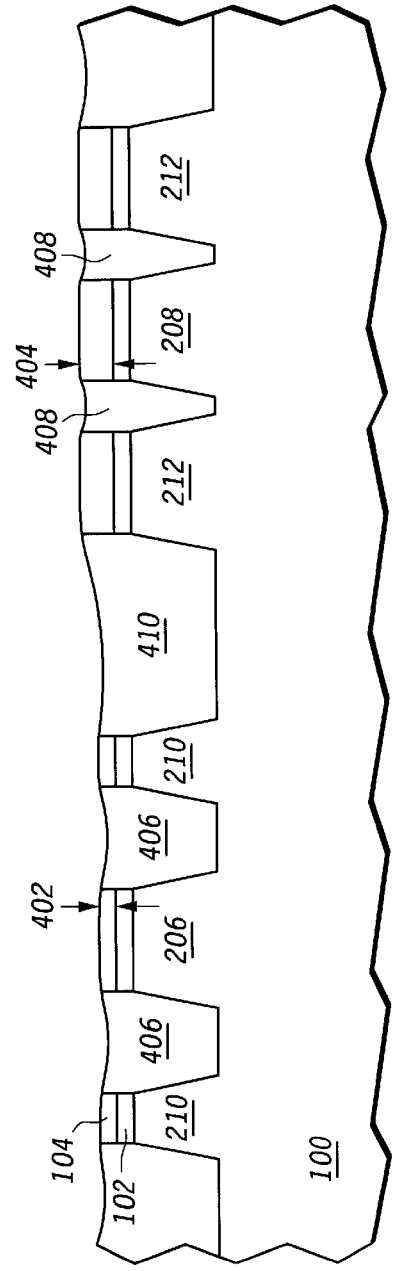
FIG. 4 illustrates a processing step subsequent to FIG. 3 in which the dielectric of FIG. 3 has been polished back.

Turning now to FIG. 4, the trench dielectric layer 302 of FIG. 3 is planarized to form isolation structures 406, 408, and 410. In one embodiment, the planarization of trench dielectric 302 is accomplished with a chemical mechanical polish (CMP) process. Typically, the CMP process is continued until the nitride layer 104 is reached. Because of varying dimensions and pitches of active regions 206 and 208 and tile structure 210 and 212, the amount of nitride layer 104 remaining over the various features after the CMP process differs. More specifically, as depicted in FIG. 4, the thickness 402 of the remaining nitride layer 104 over first active region 206 is less than the thickness 404 of the remaining nitride layer over second active region 208. It is theorized that the thickness 402 is less than the thickness 404 partially due to the placement and sizing of tile structures 210 in the vicinity of active region 206 as contrasted with the placement and sizing of tile structures 212 in the vicinity of second active region 208. More specifically, because tile structures 210 are relatively narrow and relatively distant from first active region 206, the chemical mechanical polish results in a relatively thin remaining nitride layer 402. In contrast, the relatively wide and close tile structures 212 near second active region 208 result in a relatively thick remaining nitride layer 404 after polish. Similarly, the isolation structures 406, which are relatively wide with respect to isolation structures 408, are polished back to a greater extent than the isolation structures 408. The present invention intentionally produces variation in the topography of device 101 immediately following the CMP process in anticipation of subsequent variations in the etch rates of isolation dielectrics depending upon the dopants that are introduced into the dielectric. In one embodiment, for example, the relatively narrow and distant tile structures 210 associated with active region 206 are formed in P-well regions of substrate 100 in anticipation of a lower etch rate for P-type isolation dielectric 406 than for N-type isolation dielectric 408. By deliberately forming tile structures 210 to produce a thinner isolation structure 406, the invention anticipates the topography variations that are produced by subsequent processing thereby resulting in a final profile that is substantially planar.

Figure 5:
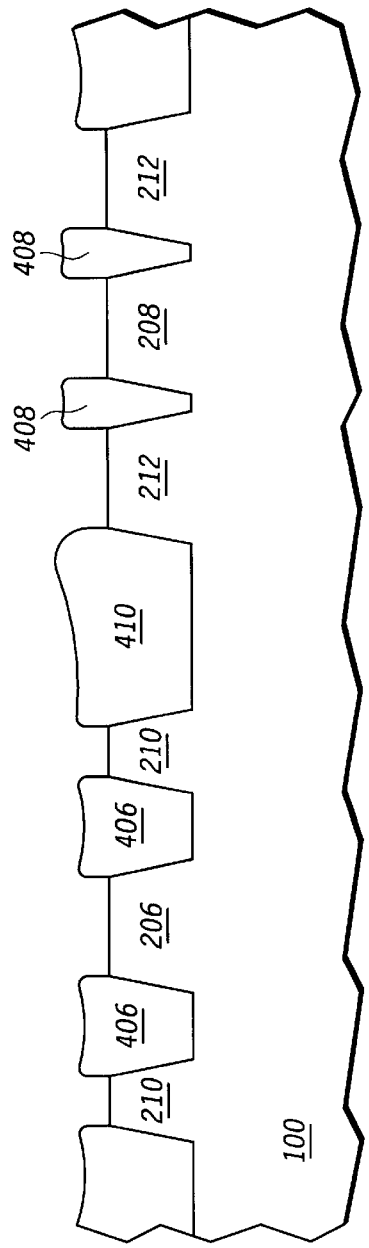
FIG. 5 illustrates a processing step subsequent to FIG. 4 in which a nitride and pad oxide layer has been removed from the wafer.

Turning now to FIG. 5, the nitride layer 104 (and 402 and 404) and pad oxide layer 102 of FIG. 4 are removed from device 101. Typically, removal of nitride layer 104 is accomplished in a hot phosphoric bath and removal of pad oxide 102 is accomplished with an HF dip. Because the thickness of pad oxide 102 is relatively small compared to isolation structures 406, removal of pad oxide 102 has relatively little effect on the height of isolation structures 406. Following removal of nitride 104 and pad oxide 102, the profile of wafer 100 includes a topography defined by first isolation structures 406 in a first region of the wafer and second isolation structures 408 in a second region of the wafer. In the depicted embodiment, the first isolation structures 406 extend above an upper surface 502 of substrate 100 by a distance that is less than the distance by which isolation structures 408 extend above upper surface 502.

Figure 6:
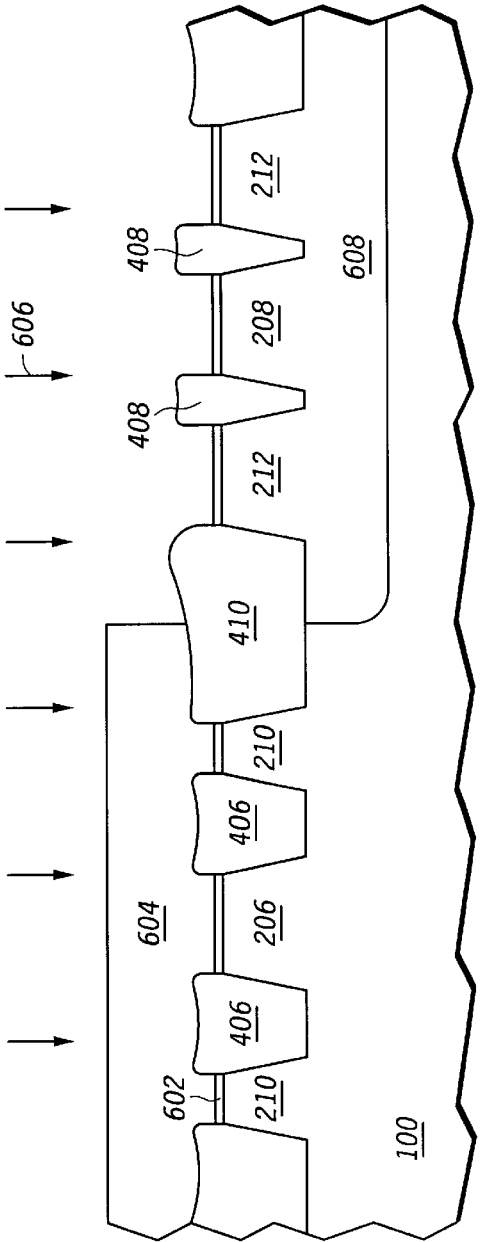
FIG. 6 illustrates a processing step subsequent to FIG. 5 in which a sacrificial oxide layer is grown and a well mask pattern is formed over the wafer and a well is formed with an ion implant.

Turning now to FIG. 6, an N-well 608 is formed in substrate 100 by defining a well mask pattern 604 over substrate 100 and thereafter introducing impurities into unmasked portions (i.e., the second region) of substrate 100 with an ion implantation process represented in FIG. 6 by reference numeral 606. In one embodiment, the well 608 is doped N-type by introducing an N-type impurity such as phosphorous or arsenic. Thus, the isolation structures 408 in the well regions 608 are simultaneously doped with the N-type impurity thereby resulting in an N-type isolation dielectric 408. In addition, a portion of dielectric structure 410, which is intermediate between the first region of substrate 100 and the second region, is partially doped with the implant 606. In the depicted embodiment, a sacrificial oxide layer 602 has been formed on substrate 100 before performing implant 606 to minimize damage to the substrate lattice.

Turning now to FIG. 7, an implant mask 702, which is substantially the complementary of implant mask 604 of FIG. 6, is formed over substrate 100 and a second well implant, identified by reference numeral 704 is performed to introduce a second well impurity into the unmasked portions (i.e., the first region) of substrate 100. In an embodiment in which well 608 comprises an N-well, the implant 704 is a P-type implant using an impurity such as, for example, boron that introduces a P-type impurity into isolation structures 406 and a portion of intermediate isolation structure 410. Thus, following the implant 704, first isolation structures 406 are doped with a first type of impurity while second isolation structures 408 are either doped with a second type of impurity or undoped. Portions of intermediate dielectric 410 may be doped with the first type of impurity while other portions of isolation structures 410 are doped with the second impurity. It is theorized that the impurity type and implant damage caused by the first impurity result in first dielectric structures 406 having a different etch rate than second dielectric structures 408. More specifically, in an embodiment in which second dielectric structures 408 are doped with phosphorous, arsenic, or another N-type impurity, the etch rate of dielectric structure 408 is greater than the etch rate of dielectric structure 406 which is doped with a P-type impurity such as boron. Boron is lighter than phosphorous and arsenic and causes less implant damage in the dielectric. Reduced implant damage correlates with a lower etch rate. An anneal of some sort after one or both well implants can alter the etch rates significantly. The etch rates due to implant and anneal are fed into the tiling model beforehand so that the tiling produces overall planarity before gate patterning. In the preferred embodiment, the differences in the dimensions of isolation structures 408 and 406 are sufficient to compensate for the variations in etch rate such that, following conventional wet etch processing prior to the formation of a gate dielectric, the upper surface of substrate 100 has a substantial uniformity over both well types.

Turning now to FIG. 8, the implant mask 702 of FIG. 7 and the sacrificial oxide 602 are removed from substrate 100 and subsequent processing, such as wet etch and cleaning processes, are performed to prepare substrate 100 for gate oxide formation. The various clean processes that may be performed before gate oxide formation include conventional RCA wet processing. As described previously, the differences in doping between first dielectric structures 406 and second dielectric structures 408 result in different etch rates. In the preferred embodiment, the thicker isolation structure 408 has an etch rate that is higher than the etch rate of the thinner dielectric structure by an amount to just compensate for the thickness variations. In other words, after the wet processing prior to the gate formation, first isolation structures 406 extend above upper surface of substrate 100 by an amount substantially the same as the amount by which second dielectric structures 408 extend above substrate 100. The difference in etch rate between first dielectric structure 406 and second dielectric structure 408 is illustrated by the variation in intermediate dielectric structure 410 which includes a portion of P-type oxide and a portion of N-type oxide. The topography in structure 410 will not be located under critical gate patterning.

Figure 9:
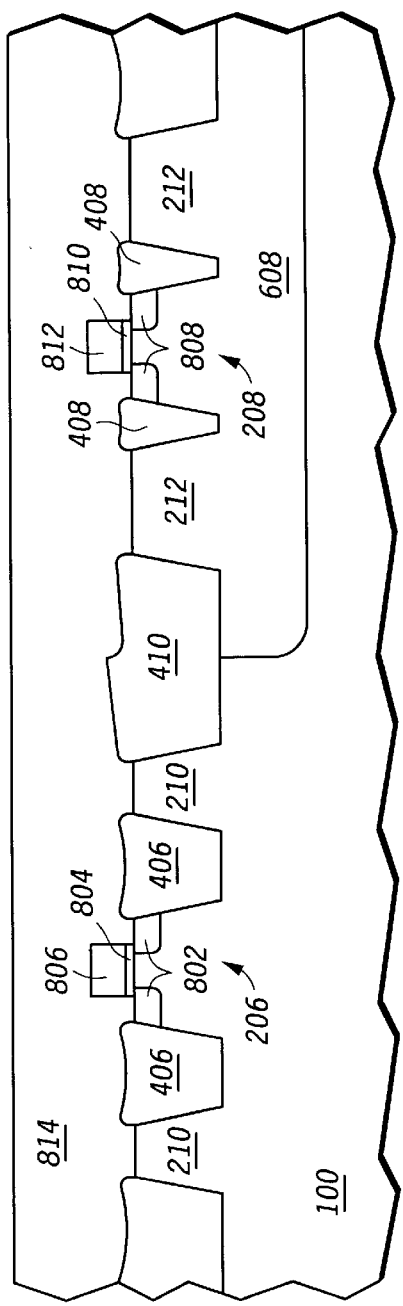
FIG. 9 illustrates a processing step subsequent to FIG. 8 in which transistors are formed in active regions of the substrate and an interlevel dielectric formed over the wafer.

Turning now to FIG. 9, subsequent processing of device 101 is performed to produce a first transistor 802 displaced between first isolation structures 406 and a second transistor 808 displaced between second isolation structures 408. First transistor 802 includes a gate dielectric 804, and gate electrode 806, and source/drain structures 802 all as will be familiar to those knowledgeable in the field of semiconductor processing. Similarly, second transistor 808 includes gate dielectric 810, a gate electrode 812, and source/drain structures 808. In one embodiment, first transistor 802 is a NMOS transistor while second transistor 808 is a PMOS transistor formed in N-well 608.

Figure 10:
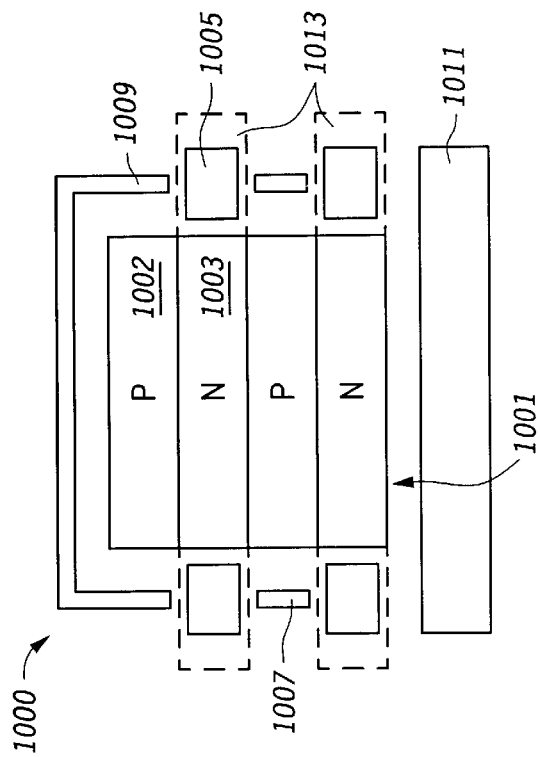
FIG. 10 is a top plan view of a layout of a portion of a semiconductor device according to one embodiment of the invention.
Figure 11:
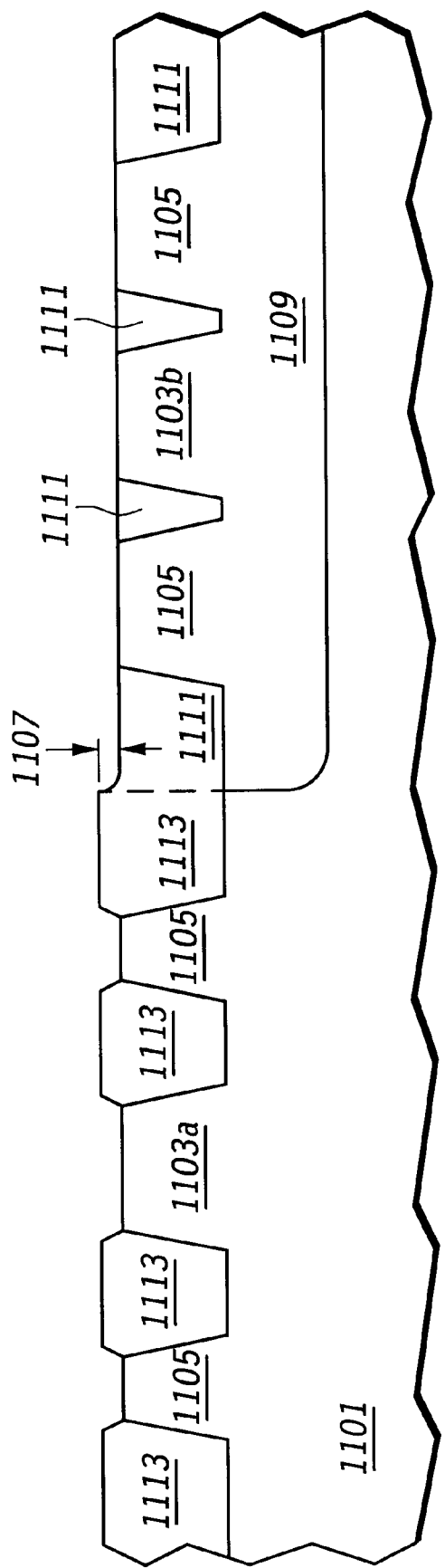
FIG. 11 illustrates a partial cross section of a semiconductor wafer fabricated according to the prior art.

Turning now to FIG. 10, a top view of a semiconductor device 1000 according to one embodiment, semiconductor 100 includes a plurality of P-well regions 1002 and a plurality of N-well regions 1003 in an array 1001. Array 1001 may comprise, for example, the cell array of a semiconductor memory. Semiconductor device 1000 includes a first tile 1009 disposed about the periphery of array 1001 where the values of design parameters including, as examples, shape, pitch, size, etc. of tile 1009 are selected according to the tiles' proximity to P-well region 1002. Semiconductor device 1000 further includes a second tile 1011 proximal to an N-well region 1003 where the design parameter values of tile 1001 are selected according to N-well region 1003. In the depicted example, tiles 1005 are placed proximal to N-well region 1003 while tiles 1007 are placed proximal to P-well region 1002 where tiles 1005 are wider and closer to their corresponding well region than tiles 1007 which are narrow and further distant from their respective well region.

Although the invention has been described with respect to specific conductivity types or polarity of potentials, skilled artisans appreciated that conductivity types and polarities of potentials may be reversed.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor device comprising:
   a first trench isolation region having an allowable tiling area and a first dopant concentration;
   a second trench isolation region having an allowable tiling area, wherein the second trench isolation region is undoped;
   first tile structures disposed within first trench isolation region, wherein the first tiles have a first set of design parameter values based upon the first conductivity of the first trench isolation region;
   second tile structure disposed within the second trench isolation region, wherein the second tiles have a second set of design parameter values based upon the second conductivity of the second trench isolation region and wherein at least one of the first set of design parameter values is different from a corresponding value in the second set of design parameter values.

2. The semiconductor device of claim 1, wherein the corresponding design parameter is selected from a group consisting of density, size, pitch, shape, exclusion distance, minimum width, minimum length, and minimum area.

3. The semiconductor device of claim 1, further comprising a first active region disposed within the first isolation region and a second active region disposed within the second isolation region.

4. The semiconductor device of claim 3, further comprising a first transistor disposed within the first active region and a second transistor disposed within the second active region.

5. The semiconductor device of claim 3, further comprising first isolation trench structures between the first active region and the first tiles and second trench isolation structures between the second active region and the second tiles.

6. A semiconductor device comprising an array that includes P-well regions and N-well regions, wherein a tile is disposed about the periphery of the array, and wherein design parameter values of the tile are selected according to a proximity to one of the P-well regions and the N-well regions.

7. The semiconductor device of claim 6, wherein the corresponding design parameter is selected from a group consisting of density, size, pitch, shape, exclusion distance, minimum width, minimum length and minimum area.

8. The semiconductor device of claim 6, wherein the array comprises the cell array of a semiconductor memory.

9. A semiconductor device comprising:
   a first trench isolation region having an allowable tiling area,
   a second trench isolation region having an allowable tiling area, wherein the second trench isolation region is doped differently from the first trench isolation region and wherein only one of either the first trench isolation region or the second trench isolation region includes tile structures.

10. The semiconductor device of claim 9, wherein doped differently is further characterized as the first trench isolation region including of a P-type dopant and an N-type dopant and the second trench isolation region including an opposite-type dopant.

11. The semiconductor device of claim 9, wherein doped differently is further characterized as a difference in doping concentration.

12. The semiconductor device of claim 11, wherein the first and second trench isolation region are doped with the same dopant type.

13. The semiconductor device of claim 9, wherein the first trench isolation region has a first dopant concentration and the second trench isolation region is undoped.

14. The semiconductor device of claim 9, further comprising a first active region disposed within the first isolation region and a second active region disposed within the second isolation region.

15. The semiconductor device of claim 14, further comprising a first transistor disposed within the first active region and a second transistor disposed within the second active region.

16. A semiconductor device comprising:
   a first trench isolation region having an allowable tiling area and a first conductivity;
   a second trench isolation region having an allowable tiling area, wherein the second trench isolation region has a second conductivity;
   first tile structures disposed within first trench isolation region, wherein the first tiles have a first set of design parameter values based upon the first conductivity of the first trench isolation region;
   second tile structure disposed within the second trench isolation region, wherein the second tiles have a second set of design parameter values based upon the second conductivity of the second trench isolation region and wherein at least one of the first set of design parameter values is different from a corresponding value in the second set of design parameter values.

17. The semiconductor device of claim 16, wherein the first trench isolation region has a first dopant concentration and the second trench isolation region has a second dopant concentration, wherein the first dopant concentration is greater than the second dopant concentration.

18. The semiconductor device of claim 16, wherein the first trench conductivity is different than the second conductivity.

19. The semiconductor device of claim 18, wherein the first conductivity is P-type and the second conductivity is N-type.

20. The semiconductor of claim 16, wherein the corresponding design parameter is selected from a group consisting of density, size, pitch, shape, exclusion distance, minimum width, minimum length and minimum area.

* * * * *